US012575103B2

(12) United States Patent
Zhang et al.

(10) Patent No.: US 12,575,103 B2
(45) Date of Patent: Mar. 10, 2026

(54) THREE-DIMENSIONAL MEMORY WITH AN ENLARGED CHANNEL CONNECTING OPENING AND FABRICATING METHOD THEREOF

(71) Applicant: YANGTZE MEMORY TECHNOLOGIES CO., LTD., Wuhan (CN)

(72) Inventors: Zhenzhen Zhang, Wuhan (CN); Longdong Liu, Wuhan (CN); Ming Li, Wuhan (CN); Ying Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 507 days.

(21) Appl. No.: 18/090,425

(22) Filed: Dec. 28, 2022

(65) Prior Publication Data

US 2023/0144830 A1 May 11, 2023

Related U.S. Application Data

(63) Continuation of application No. PCT/CN2021/034570, filed on Nov. 30, 2021.

(30) Foreign Application Priority Data

Dec. 24, 2020 (CN) .......................... 202011546787.3

(51) Int. Cl.
H10B 43/27 (2023.01)
H10B 41/27 (2023.01)
(52) U.S. Cl.
CPC ............. H10B 43/27 (2023.02); H10B 41/27 (2023.02)

(58) Field of Classification Search
CPC ... H10B 43/27; H10B 41/27; H01L 21/02019; H01L 21/30604–30621;
(Continued)

(56) References Cited

U.S. PATENT DOCUMENTS 9,847,345 B2 * 12/2017 Mori ...................... H10B 41/27
2019/0378853 A1 * 12/2019 Xiao ................... H01L 25/0657
(Continued)

FOREIGN PATENT DOCUMENTS

CN 109346476 A * 2/2019 ............. H10B 43/27
CN 111540752 A * 8/2020 ............. H10B 43/35
(Continued)

OTHER PUBLICATIONS

Zhang, Zhen-zhen et al. (Machine Translation of CN 112687701 A), Published on Apr. 20, 2021, 11 pages. (Year: 2021).*
(Continued)

*Primary Examiner* — Scott B Geyer
(74) *Attorney, Agent, or Firm* — BAYES PLLC

(57) ABSTRACT

A three-dimensional memory device and a fabricating method thereof are disclosed. The method can comprise: forming a first stack structure on a substrate and a connecting layer on the first stack structure; forming an opening through the connecting layer and a first channel hole through the first stack structure, wherein the opening is interconnected with the first channel hole; etching the connecting layer using a dry etching process to enlarge the opening, and forming a filling structure in the enlarged opening and the first channel hole. A bottom aperture of the enlarged opening is larger than a top aperture of the first channel hole. The dry etching process comprises at least a first stage dry etching and a second stage dry etching using different Radio Frequency (RF) powers.

20 Claims, 8 Drawing Sheets

Figure 2A:
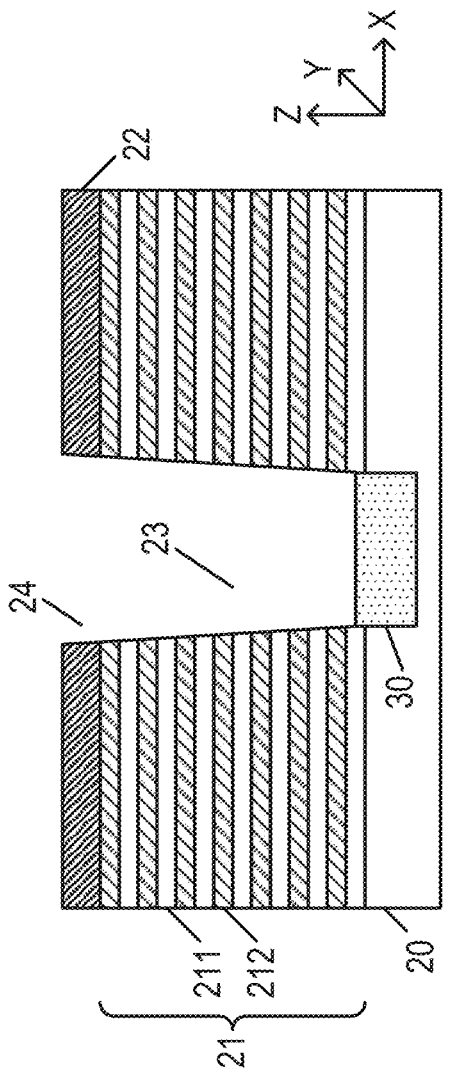

(58) Field of Classification Search
CPC ........................... H01L 21/3063–30635; H01L
21/3065–30655; H01L 21/31055–31056;
H01L 21/31111–31122; H01L
21/31133–31138; H01L 21/32133–32139;
H01L 21/465
See application file for complete search history.

(56)                     References Cited

U.S. PATENT DOCUMENTS

| | | | | |
|---|---|---|---|---|
| 2020/0135752 A1* | 4/2020 | Xiao | ................ | H01L 21/31144 |
| 2020/0303399 A1* | 9/2020 | Xiao | ................ | H01L 21/31111 |

FOREIGN PATENT DOCUMENTS

| | | | | | |
|---|---|---|---|---|---|
| CN | 111785725 A | | 10/2020 | | |
| CN | 112687701 A | | 4/2021 | | |
| CN | 111557047 B | * | 7/2021 | ............. | G11C 5/025 |
| CN | 113421834 A | * | 9/2021 | ............. | H01L 22/24 |

OTHER PUBLICATIONS

Machine Translation, CN 109346476 A, Liu et al., published Feb.
15, 2019 (Year: 2019).*

* cited by examiner

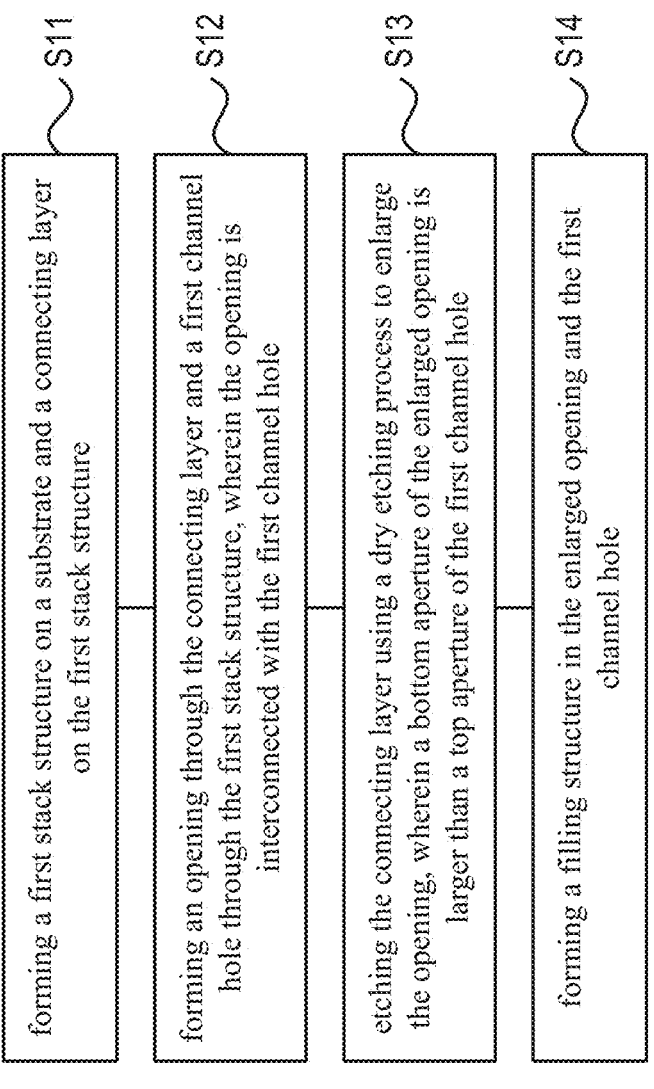

forming a first stack structure on a substrate and a connecting layer on the first stack structure  S11 forming an opening through the connecting layer and a first channel hole through the first stack structure, wherein the opening is interconnected with the first channel hole  S12 etching the connecting layer using a dry etching process to enlarge the opening, wherein a bottom aperture of the enlarged opening is larger than a top aperture of the first channel hole  S13 forming a filling structure in the enlarged opening and the first channel hole  S14

FIG. 1

THREE-DIMENSIONAL MEMORY WITH AN ENLARGED CHANNEL CONNECTING OPENING AND FABRICATING METHOD THEREOF

CROSS-REFERENCE TO RELATED APPLICATIONS

This application is a continuation of International Application No. PCT/CN2021/134570, filed on Nov. 30, 2021, which claims the priority of the Chinese Patent Application No. 202011546787.3, filed on Dec. 24, 2020, both of which are incorporated herein by reference in their entireties.

TECHNICAL FIELD

The present disclosure relates to the technical field of semiconductor fabrication and particularly to a three-dimensional memory and a fabricating method thereof.

BACKGROUND

With the development of planar flash memories, significant improvements have been made in semiconductor production processes. However, in recent years, the development of planar flash memories has encountered various challenges: the physical limit, the limit in existing developing technologies, and the limit in storage electron density, etc. In view of this, in order to address the difficulties encountered by planar flash memories and achieve lower production cost per memory cell, various different three-dimensional (3D) flash memory structures have emerged such as a 3D NOR flash and a 3D NAND flash.

Among them, 3D NAND memories have become dominant process in the emerging memory designs and production processes by using the design concept of stacking memory cells one on top of another due to their small volumes and large capacities, to produce memories each with a high integration density per unit area and high memory-cell performance.

In order to improve the integration of a 3D memory such as a 3D NAND memory, a 3D memory with a channel hole structure of two decks has emerged. The 3D memory with a channel hole structure of two decks usually includes a lower channel hole in a lower stack structure and an upper channel hole in an upper stack structure. However, in the fabrication processes, due to the limitations on the fabrication processes of the lower and upper channel holes, the 3D memory fabricated may have big defects in structure and performance, and the fabrication flows are complex with a high fabrication cost.

Therefore, how to simplify the fabrication process of the 3D memory, and reduce its fabrication cost while improving its performance and production yield are urgent problems now.

SUMMARY

The present disclosure provides a three-dimensional memory and a forming method thereof to solve the problem of complex fabrication process and high fabrication cost of the three-dimensional memory while improving its performance and production yield.

To solve the above-mentioned problem, the disclosure provides a method of forming a three-dimensional memory including the following operations of: providing a substrate, with a first stack structure on the surface of the substrate and a connecting layer covering the surface of the first stack structure; forming an opening through the connecting layer and a first channel hole through the first stack structure, wherein the opening is in communication with the first channel hole; etching only the connecting layer using a dry etching process to increase the characteristic size of the opening, such that the opening is increased to have the characteristic size at its bottom larger than that at the top of the first channel hole, and the dry etching process includes at least a first stage of dry etching and a second stage of dry etching using different Radio Frequency (RF) powers; and forming a filling layer in the opening and the empty first channel hole.

In some implementations of the disclosure, before increasing the characteristic size of the opening, the method further includes: forming an epitaxial semiconductor layer at the bottom of the first channel hole.

In some implementations of the disclosure, the operation of etching only the connecting layer using the dry etching process includes: performing the first stage of dry etching on the connecting layer; performing the second stage of dry etching on the connecting layer with a RF power lower than that used in the first stage of dry etching.

In some implementations of the disclosure, the operation of performing the first stage of dry etching on the connecting layer includes: introducing an etching gas under a first RF frequency and a first RF power and introducing a conditioning gas under a second RF frequency and a second RF power to perform the first stage of dry etching on the connecting layer, wherein the first RF frequency is lower than the second RF frequency, the first RF power is greater than the second RF power, the etching gas is used to etch the connecting layer and the conditioning gas is used to regulate the rate of etching the connecting layer by the etching gas; the operation of performing the second stage of dry etching on the connecting layer includes: introducing the etching gas under the first RF frequency and a third RF power and introducing the conditioning gas under the second RF frequency and a fourth RF power to perform the second stage of dry etching on the connecting layer, wherein the third RF power is less than the first RF power, and the fourth RF power is less than the second RF power.

In some implementations, the third RF power and the fourth RF power are the same as each other and both of them are less than the second RF power.

In some implementations of the disclosure, the first RF power is about 2 to 5 times of the second RF power; the first RF power is about 30 to 120 times of the third RF power.

In some implementations of the disclosure, the first RF frequency is in the range of about 350 KHz~450 KHz, and the second RF frequency is in the range of about 55 MHz~65 MHz; the first RF power is in the range of about 17500 W~20000 W, the second RF power is in the range of about 4500 W~6500 W, and the third RF power is in the range of about 200 W~500 W.

In some implementations of the disclosure, the flow rate of the conditioning gas is greater than that of the etching gas.

In some implementations of the disclosure, the flow rate of the conditioning gas is about 20 to 300 times of the flow rate of the etching gas.

In some implementations of the disclosure, the flow rate of the conditioning gas is in the range of about 1000 sccm~3000 sccm, and the flow rate of the etching gas is in the range of about 10 sccm~50 sccm.

In some implementations of the disclosure, the material of the connecting layer is an oxide material; the etching gas is a gas containing the elements of carbon and fluorine; the conditioning gas is oxygen.

In some implementations of the disclosure, the operation of forming a filling layer in the opening and the empty first channel hole includes: depositing a filling material into the empty first channel hole and the opening to form the filling layer filling in the first channel hole and the opening and closing the top of the opening.

In some implementations of the disclosure, after forming the filling layer in the first channel hole and the opening, the following operations are further included: forming a second stack structure on the surface of the connecting layer; etching the second stack structure and a portion of the filling layer to form a second channel hole extending through the second stack structure into the opening, wherein the second channel hole is aligned with the first channel hole and the portion of the filling layer remaining in the opening at least covers the whole sidewall of the opening.

To solve the above-mentioned problem, the disclosure further provides a three-dimensional memory including: a substrate, with a first stack structure on the surface of the substrate and a connecting layer covering the surface of the first stack structure;

a first channel hole through the first stack structure; an opening that is located in the connecting layer, is in communication with the first channel hole, the characteristic size at the bottom of the opening being larger than that at the top of the first channel hole.

The three-dimensional memory can be formed by performing the method of any of the implementations above.

In the three-dimensional memory and fabrication method thereof provided by the disclosure, after forming the first channel hole in the first stack structure by etching and forming the opening that is in communication with the first channel hole in the connecting layer at the top of the first stack structure, the characteristic size of the opening in the connecting layer is increased, such that the opening is increased to have the characteristic size at its bottom larger than that at the top of the first channel hole, which can broaden the window of subsequently aligning the second channel hole with the first channel hole on one hand and prevent the sidewall of the first channel hole from being damaged during subsequent processes on the other hand, improving the performance and production yield of the three-dimensional memory effectively. In addition, the filling process is only performed once to form the filling layer in the first channel hole and the opening, which can simplify the fabrication operations of the three-dimensional memory significantly and reduce its fabrication cost.

BRIEF DESCRIPTION OF ACCOMPANYING DRAWINGS

Figure 2B:
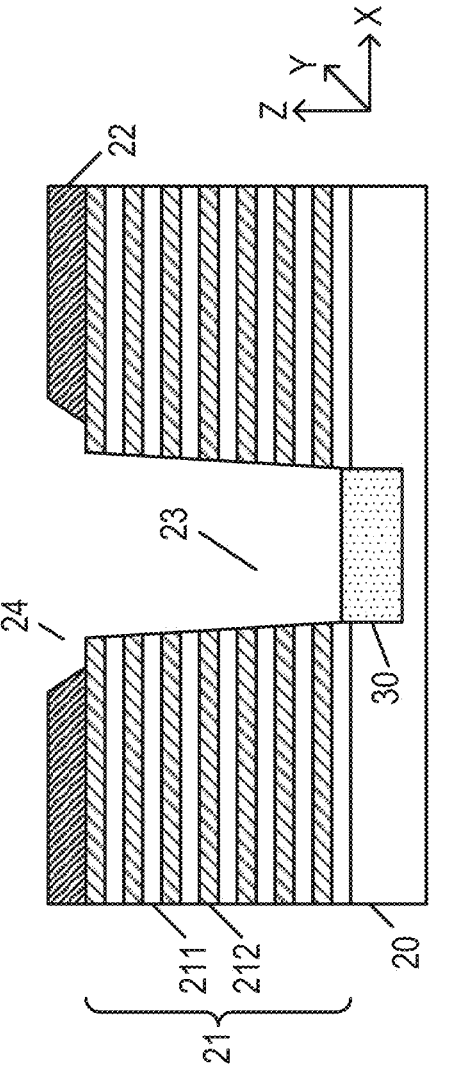
Figure 2C:
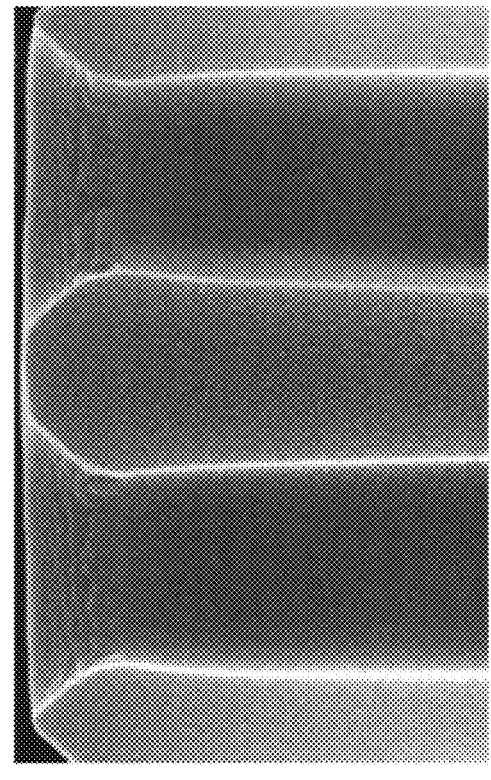
Figure 2D:
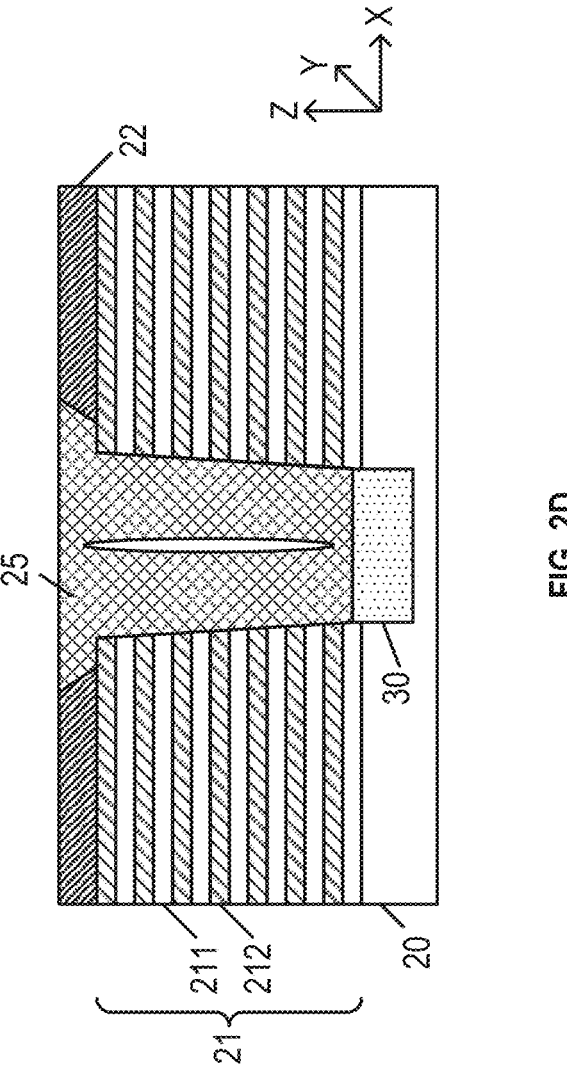
Figure 2E:
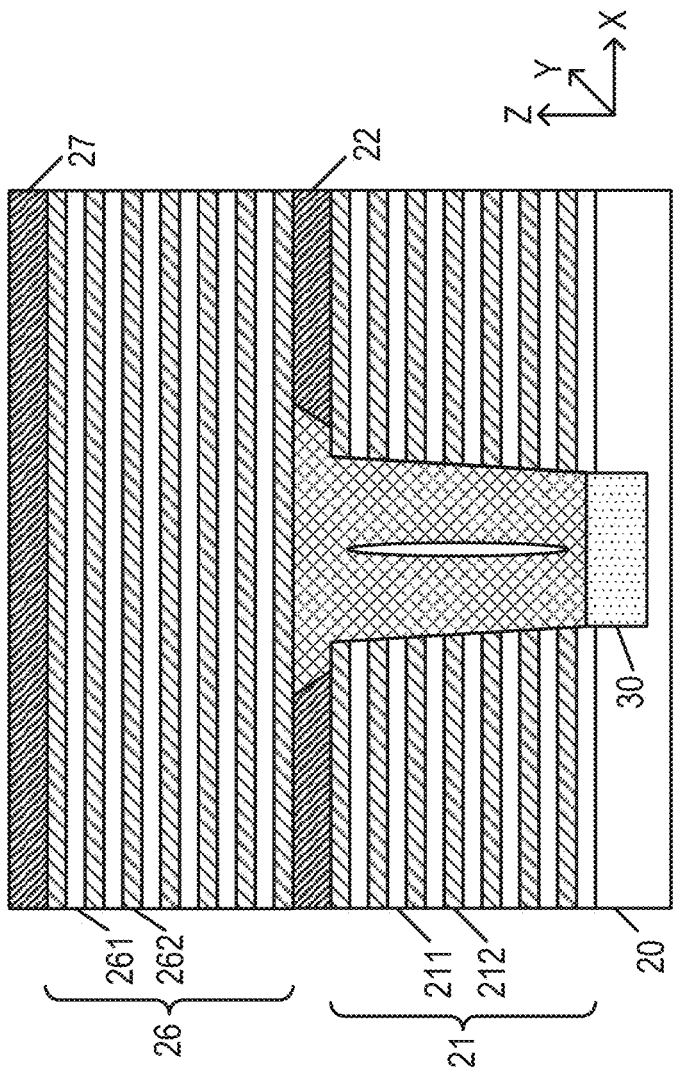
Figure 2F:
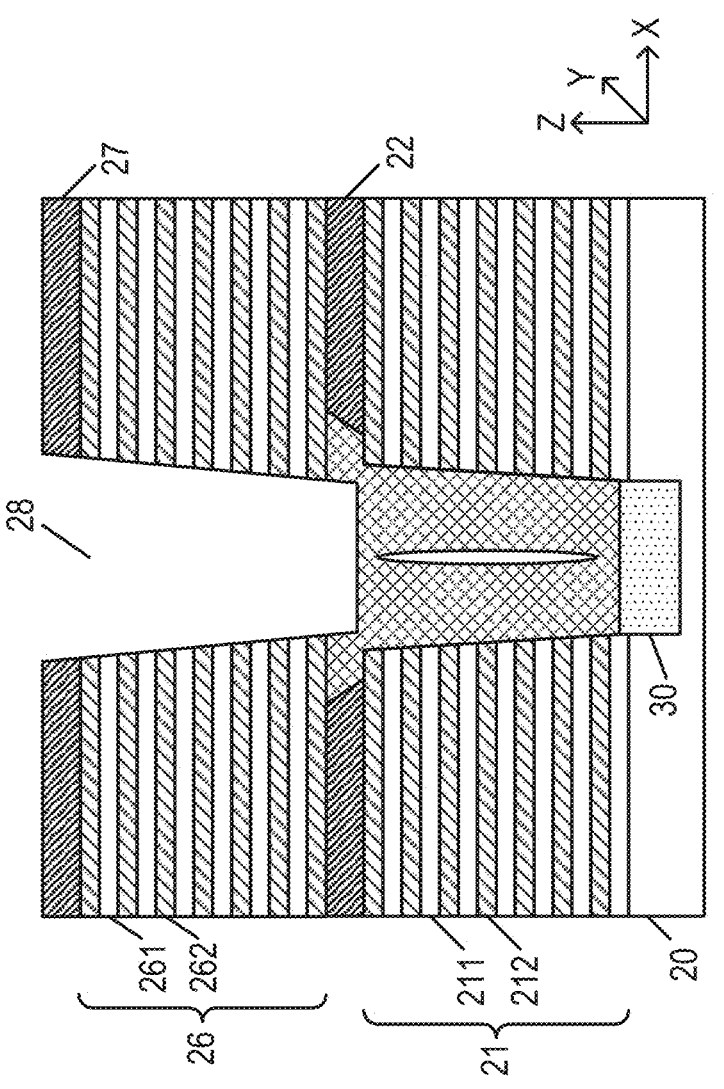
Figure 3:
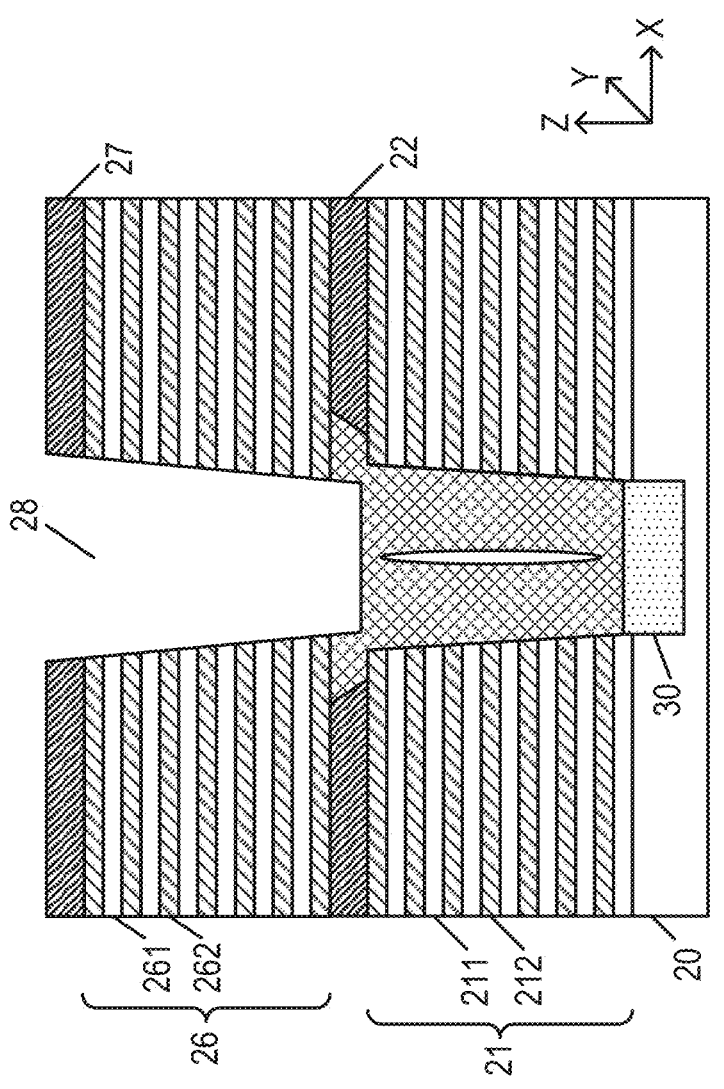

In order to make the above-mentioned purpose, features and advantages of the disclosure more apparent and easier to understand, specific implementations of the disclosure will be described in detail below with reference to accompanying drawings, wherein FIG. 1 is a flow chart of a method of forming a three-dimensional memory in an implementation of the disclosure;

FIGS. 2A-2F are cross-sections of main processes during formation of a three-dimensional memory in an implementation of the disclosure; and FIG. 3 is a structural diagram of a three-dimensional memory provided by an implementation of the disclosure.

DETAILED DESCRIPTION

Implementations of the three-dimensional memory and the forming method thereof provided by the disclosure will be described in detail below with reference to accompanying drawings During the formation of a three-dimensional memory with a two-deck channel hole, a process currently used generally includes the following sequential operations: forming a lower stack structure and a connecting layer covering the lower stack structure; etching the lower stack structure and the connecting layer to form a lower channel hole; then depositing a first filling layer over the sidewall of the lower channel hole and the surface of connecting layer; subsequently removing the portion of the first filling layer covering the sidewall of the connecting layer and the sidewall at the top of the lower channel hole by an etching process to expose the connecting layer at the sidewall of the lower channel hole; then removing a portion of the connecting layer at the top of the lower channel hole by a wet etching process to form a trench in the connecting layer; and finally depositing a second filling layer in the lower channel hole and the trench. Using the process above, the window of subsequently aligning the lower channel hole with the upper channel hole may be broadened, however, the cost of wet etching process is high, and the operation is complex, on the other hand, two deposition processes are used, which further complicate the fabrication process. If the trench in the connecting layer is not formed by the wet etching process, the upper channel hole and the lower channel hole may be misaligned subsequently, and damage may occur to the sidewall of the lower channel hole.

In order to simplify the fabrication operations and reduce the fabrication cost of the three-dimensional memory while the alignment between the upper channel hole and the lower channel hole being guaranteed, a method of forming a three-dimensional memory is provided in this detailed description. FIG. 1 is a flow chart of the method of forming a three-dimensional memory in this implementation of the disclosure, and FIGS. 2A-2F are schematic views of cross-sections of main processes during formation of the three-dimensional memory in this implementation of the disclosure. The three-dimensional memory described in this implementation may be, but not limited to, a 3D NAND memory. As shown in FIG. 1 and FIGS. 2A-2E, the method of forming a three-dimensional memory provided by the detailed description includes the following operations.

In operation S11, a substrate 20 is provided with a first stack structure 21 on the surface of the substrate 20 and a connecting layer 22 covering the surface of the first stack structure 21, as shown in FIG. 2A.

Specifically, the substrate 20 may be a Si substrate, a Ge substrate, a SiGe substrate, a SOI (Silicon On Insulator), a GOI (Germanium On Insulator) or the like. In this implementation, the substrate 20 may be a silicon substrate to provide a support for device structures thereover.

The first stack structure 21 includes first interlayer insulating layers 211 and first sacrificial layers 212 alternately stacked in the direction from the substrate 20 toward the first stack structure 21 (i.e., the Z direction in FIG. 2A). The number of tiers in which the first interlayer insulating layers 211 and the first sacrificial layers 212 are alternately stacked can be configured by one skilled in the art according to practical needs. The higher the number of tiers in which the first interlayer insulating layers 211 and the first sacrificial layers 212 are alternately stacked, the higher the integration of the formed three-dimensional memory is. The one of the first sacrificial layers 212 at top of the first stack structure 21 is in contact with the connecting layer 22. The materials for the first interlayer insulation layers 211 may be, but not limited to, oxide materials, for example, silicon dioxide, and the materials for the first sacrificial layers 212 may be, but not limited to, nitride materials, for example, silicon nitride. In order to facilitate the later selective etching, the material of the connecting layer 22 should have a high etching selectivity ratio with respect to the material of first sacrificial layer 212 (e.g., a ratio greater than 3). The material of the connecting layer 22 may be, but not limited to, an oxide material.

In operation S12, an opening 24 through the connecting layer 22 and a first channel hole 23 through the first stack structure 21 are formed, the opening 24 being in communication with the first channel hole 23, as shown in FIG. 2A.

Specifically, the connecting layer 22 and the first stack structure 21 may be etched by a dry or wet etching process to form the first channel hole 23 and the opening 24. The first channel hole 23 penetrates the first stack structure 21 in the direction from the substrate 20 toward the first stack structure 21 (i.e., the Z direction in FIG. 2A), the opening 24 penetrates the connecting layer 22 in the direction from the substrate 20 toward the first stack structure 21, and the opening 24 is in communication with the first channel hole 23.

In operation S13, the characteristic size (also referred as "aperture") of the opening 24 is increased such that the opening 24 is increased to have a characteristic size at its bottom larger than that at the top of the first channel hole 23, as shown in FIG. 2B and FIG. 2C, wherein FIG. 2C is a transmission electron microscope image of FIG. 2B.

In some implementations of the disclosure, before increasing the characteristic size of the opening 24, the following operation is further included: forming an epitaxial semiconductor layer at the bottom of the first channel hole 23.

Specifically, the epitaxial semiconductor layer 30 is first formed at the bottom of the first channel hole 23 using an epitaxial growth process, and then processed by a wet oxidation process to form a protection layer of oxide on the surface of the epitaxial semiconductor layer 30 to prevent the epitaxial semiconductor layer 30 from being damaged during subsequent processes.

In some implementations of the disclosure, the operation of increasing the characteristic size of the opening 24 includes: etching only the connecting layer 22 using a dry etching process to increase the characteristic size of the opening 24.

Specifically, since wet etching processes have complex operations and high costs, in this implementation, a dry etching process is used to etch the connecting layer 22 after the formation of the first channel hole 23 in the first stack structure 21 and the formation of the opening 24 in the connecting layer 22. Moreover, parameters of the dry etching process such as its Radio Frequency (RF) frequency and RF power are adjusted to enable only the connecting layer 22 to be etched during the dry etching process. In addition, since only the connecting layer 22 can be etched by adjustment of the parameters of etching in this operation, the stack structure 21 exposed at the sidewall of the first channel hole 23 will not be damaged, so that there is no need to deposit filling materials into the first channel hole 23 before etching the connecting layer 22 using the dry etching process in this operation.

In some implementations of the disclosure, the operation of etching only the connecting layer 22 using the dry etching process includes: performing a first stage of dry etching on the connecting layer 22; and performing a second stage of dry etching on the connecting layer 22 with a RF power lower than that used in the first stage of dry etching.

In some implementations of the disclosure, the operation of performing the first stage of dry etching on the connecting layer 22 includes: introducing an etching gas under a first RF frequency and a first RF power and introducing a conditioning gas under a second RF frequency and a second RF power to perform the first stage of dry etching on the connecting layer 22, wherein the first RF frequency is lower than the second RF frequency, the first RF power is greater than the second RF power, the etching gas is used to etch the connecting layer 22 and the conditioning gas is used to regulate the rate of etching the connecting layer by the etching gas; and the operation of performing the second stage of dry etching on the connecting layer 22 includes: introducing the etching gas under the first RF frequency and a third RF power and introducing the conditioning gas under the second RF frequency and a fourth RF power to perform the second stage of dry etching on the connecting layer 22, wherein the third RF power is less than the first RF power, and the fourth RF power is less than the second RF power.

Specifically, during the process of increasing the characteristic size of the opening in the connecting layer 22, the first stage of dry etching and the second stage of dry etching are used in combination. In the first stage of dry etching, the connecting layer 22 is impacted with a relatively high RF power to control the etching depth, such that only the connecting layer 22 can be etched in the process of the first stage of dry etching. After the first stage of dry etching, the first sacrificial layer 212 at the top of the first stack structure 21 is exposed at the bottom of the opening 24. Subsequently, by using the first sacrificial layer 212 at top of the first stack structure 21 as an etch stop layer, the connecting layer 22 is etched with a relatively low RF power to further increase the characteristic size of the opening 24.

When performing the first stage of dry etching, first introducing the etching gas under the first RF frequency and the first RF power and introducing the conditioning gas under the second RF frequency and the second RF power, the etching gas and the conditioning gas cooperate to increase the etching rate of the first stage of dry etching and to save the time for etching. When performing the second stage of dry etching, first introducing the etching gas udner the first RF frequency and the third RF power and introducing the conditioning gas under the second RF frequency and the fourth RF power, the etching gas and the conditioning gas cooperate to increase the etching rate of the second stage of dry etching and to save the time for etching. Wherein the specific type of the etching gas can be selected by one skilled in the art according to the specific material of the connecting layer 22. And the specific type of the conditioning gas can be selected according to the specific type of the etching gas and the specific material of the connecting layer 22.

The specific values of the third RF power and the fourth RF power can be selected by one skilled in the art according to practical needs. To simplify operation operations, in some implementations of the disclosure, the third RF power and the fourth RF power are the same as each other and both of them are less than the second RF power.

In some implementations of the disclosure, the first RF power is 2 to 5 times of the second RF power; the first RF power is 30 to 120 times of the third RF power.

In some implementations, the first RF frequency is in the range of about 350 KHz~450 KHz, and the second RF frequency is in the range of about 55 MHz~65 MHz; the first RF power is in the range of about 17500 W~20000 W, the second RF power is in the range of about 4500 W~6500 W, and the third RF power is in the range of about 200 W~500 W.

In some implementations, the flow rate of the conditioning gas is greater than that of the etching gas.

In some implementations of the disclosure, the flow rate of the conditioning gas is about 20 to 300 times of that of the etching gas.

In some implementations of the disclosure, the flow rate of the conditioning gas is in the range of about 1000 sccm~3000 sccm while the flow rate of the etching gas is in the range of about 10 sccm~50 sccm.

In some implementations of the disclosure, the material of the connecting layer 22 is an oxide material; the etching gas is a gas containing the elements of carbon and fluorine; the conditioning gas is oxygen.

The case in which the material of the connecting layer 22 is an oxide material (e.g., silicon dioxide) will be taken as an example hereafter. The operation of etching only the connecting layer 22 is divided into two stages of dry etching. In the first stage of dry etching, the etching gas is introduced continuously under a RF frequency of about 400 kHz and a RF power in the range of about 17500 W~20000 W and the conditioning gas is introduced continuously under a RF frequency of about 60 MHz and a RF power in the range of about 4500 W~6500 W, then the etching gas and the conditioning gas cooperate to etch the connecting layer 22; and in the second stage of dry etching, the etching gas is introduced continuously under a RF frequency of about 400 kHz and a RF power in the range of about 200 W~500 W and the conditioning gas is introduced continuously under a RF frequency of about 60 MHz and a RF power in the range of about 200 W~500 W, then the etching gas and the conditioning gas cooperate to etch the connecting layer 22 again. The total time of the first and second stages of dry etching is longer than about 60 s. The etching time of the first stage of dry etching is shorter than that of the second stage of dry etching. For example, the etching time of the first stage of dry etching is in the range of about 5 s~25 s and the etching time of the second stage of dry etching is in the range of about 35 s~55 s. The specific values of the etching time of the first stage of dry etching and the etching time of the second stage of dry etching may be adjusted according to the thickness of the connecting layer 22 and the types of the gases used. The etching gas used in the first stage of dry etching and the etching gas used in the second stage of dry etching are both $CF_4$, while the conditioning gas used in the first stage of dry etching and the conditioning gas used in the second stage of dry etching are both $O_2$. In both the first and the second stages of dry etching, the flow rate of $CF_4$ may be in the range of about 10 sccm~50 sccm, and the flow rate of $O_2$ may be in the range of about 1000 sccm~3000 sccm. By controlling the above-mentioned etching parameters, only the connecting layer 22 is etched in both the first and the second stages of dry etching while the stack structure 21 exposed at the sidewall of the first channel hole 23 would not be etched.

In this operation, only the connecting layer 22 is aimed to be etched, so that the opening 24 is increased to have a characteristic size larger than that of the first channel hole 23. As a result, not only the window of aligning a second channel hole 28 formed subsequently with the first channel hole 23 is broadened, but also the sidewalls of the increased opening 24 are planar, which ensures a good contact with the subsequent charge storage layer, and further ensures a good electrical conduction between the first channel hole 23 and the subsequent second channel hole 28.

The specific shape of the cross section of the increased opening 24 may be, but not limited to, a trapezoid. The increased opening 24 has the characteristic size at its bottom (i.e., the end of the opening 24 in contact with the first stack structure 21) smaller than that at its top (i.e., the end of the opening 24 opposite to the bottom) and larger than that at the top of the first channel hole 23 (i.e., the end of the channel hole 23 in contact with the connecting layer 22).

In some implementations of the disclosure, in the radial direction of the channel hole 23, a distance between the sidewall of the increased opening 24 and the sidewall of first channel hole 23 is in the range of about 5 nm~6 nm.

Specifically, in the X-axis direction in FIG. 2B, a distance between the sidewall of the increased opening 24 and the sidewall of the first channel hole 23 on the same side is in the range of about 5 nm~6 nm, such that alignment of the second channel hole 28 formed subsequently with the first channel hole 23 can be ensured.

In operation S14, a filling layer 25 (also referred as "filling structure") is formed in the opening 24 and the empty first channel hole 23, as shown in FIG. 2D.

In some implementations of the disclosure, the operation of forming the filling layer 25 in the opening 24 and the empty first channel hole 23 includes: depositing a filling material into the empty first channel hole 23 and the opening 24 to form the filling layer 25 filling in the first channel hole 23 and the opening 24 and closing the top of the opening 24.

Specifically, by means of adjustment of etching parameters, no damage can be caused to the first stack structure 21 exposed in the first channel hole 23 in the process of increasing the characteristic size of the opening 24 by etching, so that the first channel hole 23 does not need to be filled before increasing the opening 24. After increasing the opening 24, a one-operation filling process is further used to form the filling layer 25 filling in the first channel hole 23 and the opening and closing the top of the opening 24, greatly simplifying the fabrication operations of the three-dimensional memory. The material of the filling layer 25 may be, but not limited to, polysilicon material.

In some implementations of the disclosure, after forming the filling layer 25 in the first channel hole 23 and the opening 24, the following operations are further included: forming a second stack structure 26 on the surface of a connecting layer 22, as shown in FIG. 2E; etching the second stack structure 26 and a portion of the filling layer 25 to form the second channel hole 28 extending through the second stack structure 26 into the opening 24, wherein the second channel hole 28 is in alignment with the first channel hole 23 and the portion of the filling layer 25 remaining in the opening 24 at least covers the whole sidewall of the opening 24, as shown in FIG. 2F.

Specifically, the second stack structure 26 includes second interlayer insulating layers 261 and second sacrificial layers 262 alternately stacked in the direction from the substrate 20 toward the first stack structure 21 (i.e., the Z direction in FIG. 2E). The number of tiers in which the second interlayer insulating layers 261 and the second sacrificial layers 262 are alternately stacked can be configured by one skilled in the art according to practical needs and may be the same as or different from that of the first stack structure 21. The surface of the second stack structure 26 is further covered with a cover layer 27. One of the second sacrificial layers 262 on top of the second stack structure 26 is in contact with the cover layer 27. The materials for the second interlayer insulation layers 261 may be, but not limited to, oxide materials, for example, silicon dioxide, and the materials for the second sacrificial layers 262 may be, but not limited to, nitride materials, for example, silicon nitride. The material of the cover layer 27 may be, but not limited to, an oxide material.

By etching the cover layer 27, the second stack structure 26 and a portion of the filling layer 25 using an etching process, the second channel hole 28 extending through the second stack structure 26 into the opening 24 in the direction from the substrate 20 toward the first stack structure 21 (i.e., the Z direction in FIG. 2F) is formed at a position in alignment with that of the first channel hole 23. Since the opening 24 is formed to be regular and planar and the characteristic size the opening 24 is larger than that of the first channel hole 23, during the etching of the second channel hole 28 the whole sidewall of the opening 24 may have the filling layer 25 remaining thereon and thereby no damage may be caused to the sidewall of the first channel hole 23.

Not only that, but this implementation further provides a three-dimensional memory, and FIG. 3 is a structural diagram of the three-dimensional memory provided by this implementation of the disclosure. The three-dimensional memory provided by this implementation may be formed using the method as shown in FIG. 1 and FIGS. 2A-2F. The three-dimensional memory described in this implementation may be, but not limited to, a 3D NAND memory. As show in FIG. 3, the three-dimensional memory provided by this implementation includes: a substrate 20, with a first stack structure 21 on the surface of the substrate 20 and a connecting layer 22 covering the surface of the first stack structure 21; a first channel hole 23 through the first stack structure 21; an opening 24 that is located in the connecting layer 22, is in communication with the first channel hole 23 and has the characteristic size at its bottom larger than that at the top of the first channel hole 23.

In the three-dimensional memory and fabrication method thereof provided by this implementation, after forming the first channel hole in the first stack structure and forming the opening in the connecting layer that is in communication with the first channel hole by etching, the characteristic size of the opening in the connecting layer is increased, so that the opening is increased to have the characteristic size at its bottom larger than that at the top of the first channel hole, which can broaden the window of aligning the subsequent second channel hole with the first channel hole on one hand and prevent the sidewall of the first channel hole from being damaged during subsequent processes on the other hand, thereby improving the performance and production yield of the three-dimensional memory effectively. In addition, the filling process is only performed once to form the filling layer in the first channel hole and the opening, which can simplify the fabrication operations of the three-dimensional memory significantly and reducing its fabrication cost.

What have been described above are only some implementations of the disclosure. It is to be noted that, improvements and modifications can be further made by one skilled in the art without departing from the principle of the disclosure, which should also be considered to fall in the scope of the disclosure.

What is claimed is:

1. A method of forming a three-dimensional memory, comprising:
   forming a first stack structure and a connecting layer on the first stack structure;
   forming an opening through the connecting layer and a first channel hole through the first stack structure, wherein the opening is interconnected with the first channel hole;
   etching the connecting layer using a dry etching process to enlarge the opening, wherein a bottom aperture of the enlarged opening is larger than a top aperture of the first channel hole, the dry etching process comprises at least a first stage dry etching and a second stage dry etching using different Radio Frequency (RF) powers; and
   forming a filling structure in the enlarged opening and the first channel hole.

2. The method of claim 1, further comprising:
   before enlarging the opening, forming an epitaxial semiconductor layer at a bottom of the first channel hole on a substrate.

3. The method of claim 2, wherein etching the connecting layer comprises:
   performing the first stage dry etching on the connecting layer with a first RF power; and
   performing the second stage dry etching on the connecting layer with a third RF power lower than the first RF power.

4. The method of claim 3, wherein performing the first stage dry etching comprises:
   introducing an etching gas to etch the connecting layer with a first RF frequency and the first RF power; and
   introducing a conditioning gas to adjust an etching rate of the connecting layer by the etching gas with a second RF frequency higher than the first RF frequency and a second RF power lower than the first RF power.

5. The method of claim 4, wherein performing the second stage dry etching comprises:
   introducing the etching gas to further etch the connecting layer with the first RF frequency and the third RF power; and
   introducing the conditioning gas to further adjust the etching rate of the connecting layer by the etching gas with the second RF frequency and a fourth RF power lower than the second RF power.

6. The method of claim 5, wherein:
   the third RF power are substantially equal to the fourth RF power; and
   a duration time of the first stage dry etching is shorter than a duration time of the second stage dry etching.

7. The method of claim 5, wherein:
   the first RF power is about 2 to about 5 times of the second RF power; and
   the first RF power is about 30 to about 120 times of the third RF power.

8. The method of claim 5, wherein:
   the first RF power is in a range of about 17500 W to about 20000 W;
   the second RF power is in a range of about 4500 W to about 6500 W; and
   the third RF power is in a range of about 200 W to about 500 W.

9. The method of claim 4, wherein:
   the first RF frequency is in a range of about 350 KHz to about 450 KHz; and the second RF frequency is in a range of about 55 MHz to about 65 MHz.

10. The method of claim 4, wherein a flow rate of the conditioning gas is greater than a flow rate of the etching gas.

11. The method of claim 10, wherein the flow rate of the conditioning gas is about 20 to about 300 times of the flow rate of the etching gas.

12. The method of claim 10, wherein:

the flow rate of the conditioning gas is in a range of about 1000 sccm to about 3000 sccm; and the flow rate of the etching gas is in a range of about 10 sccm to about 50 sccm.

13. The method of claim 4, wherein:

the connecting layer includes an oxide material;

the etching gas contains carbon elements and fluorine elements; and the conditioning gas includes oxygen.

14. The method of claim 1, wherein forming the filling structure comprises:

depositing a filling material into the first channel hole and the opening to form the filling structure filling in the first channel hole and the opening and closing the top of the opening.

15. The method claim 1, further comprising:

forming a second stack structure on the connecting layer and the filling structure; and etching the second stack structure and a portion of the filling structure to form a second channel hole extending through the second stack structure into the filing structure.

16. The method claim 15, wherein:

the second channel hole is aligned with the first channel hole; and a remaining portion of the filling structure covers a sidewall of the connecting layer.

17. A three-dimensional memory device, comprising:

a first stack structure;

a connecting layer on the first stack structure;

a first channel hole through the first stack structure;

an opening through the connecting layer and interconnected with the first channel hole, wherein a bottom aperture of the opening is larger than a top aperture of the first channel hole; and a filling structure including a first portion filling in the opening and a second portion filling in the first channel hole;

wherein the first portion and the second portion have a same material.

18. The memory device of claim 17, further comprising:

a second stack structure on the connecting layer;

a second channel hole through the second stack structure; and wherein the filling structure covers a sidewall of the connecting layer, such that the connecting layer is not exposed by the opening, the first channel hole, or the second channel hole.

19. The memory device of claim 18, wherein:

the connecting layer includes an oxide material; and the filling structure includes polysilicon.

20. The memory device of claim 17, wherein:

the memory device is a three-dimensional NAND memory device.

* * * * *